US 8,892,268 B2

(12) United States Patent
Huomo

(10) Patent No.: US 8,892,268 B2
(45) Date of Patent: Nov. 18, 2014

(54) POWER FLOW MEASUREMENT AND MANAGEMENT

(75) Inventor: Heikki Huomo, Oulu (FI)

(73) Assignee: Reactive Technologies Limited, Oxford (GB)

( * ) Notice: Subject to any disclaimer, the term of this patent is extended or adjusted under 35 U.S.C. 154(b) by 347 days.

(21) Appl. No.: 12/714,879

(22) Filed: Mar. 1, 2010

(65) Prior Publication Data
US 2011/0181109 A1 Jul. 28, 2011

(30) Foreign Application Priority Data

Jan. 28, 2010 (GB) .................................. 1001397.7

(51) Int. Cl.
*G05D 3/12* (2006.01)
*H02J 3/06* (2006.01)
(52) U.S. Cl.
CPC ........................................ *H02J 3/06* (2013.01)
USPC ............................................ 700/296; 702/61
(58) Field of Classification Search
USPC .............. 700/286, 291, 295–297; 702/61–62; 320/109
See application file for complete search history.

(56) References Cited

U.S. PATENT DOCUMENTS

| | | | | |
|---|---|---|---|---|
| 4,858,141 | A * | 8/1989 | Hart et al. ........................ | 702/61 |
| 5,481,140 | A * | 1/1996 | Maruyama et al. ............. | 307/11 |
| 6,188,205 | B1 | 2/2001 | Tanimoto et al. | |
| 7,430,545 | B2 | 9/2008 | Kanbara et al. | |
| 7,885,917 | B2 * | 2/2011 | Kuhns et al. .................... | 706/48 |
| 2005/0107892 | A1 * | 5/2005 | Matsui et al. ................... | 700/28 |
| 2007/0185665 | A1 | 8/2007 | Roytelman | |
| 2007/0276547 | A1 | 11/2007 | Miller | |
| 2008/0114499 | A1 * | 5/2008 | Hakim et al. ................. | 700/291 |
| 2009/0043519 | A1 | 2/2009 | Bridges et al. | |
| 2009/0045804 | A1 * | 2/2009 | Durling et al. ............ | 324/140 R |
| 2009/0062967 | A1 * | 3/2009 | Kressner et al. .............. | 700/286 |

(Continued)

FOREIGN PATENT DOCUMENTS

| CN | 101071524 A | 11/2007 |
|---|---|---|
| CN | 101312362 A | 11/2008 |

(Continued)

OTHER PUBLICATIONS

M.P.F. Hommelberg et al, "Distributed Control Concepts using Multi-Agent technology and Automatic Markets: an indispensable feature of smart power grids," Power Engineering Society General Meeting, Jun. 1, 2007, pp. 1-7, XP031118635.

(Continued)

*Primary Examiner* — Sean Shechtman
(74) *Attorney, Agent, or Firm* — EIP US LLP

(57) ABSTRACT

Methods and systems for measuring and/or managing power consumption by power units connected to an electricity distribution network are disclosed. Power flow to and/or from a power unit connected to an electricity distribution network is controlled in accordance with a control sequence, such that the consumption and/or provision of power by the power unit results in a power flow having a predefined flow pattern, and having a characteristic, such as an amplitude, which can be remotely measured. This measurement may be performed using a method in which a signal indicative of power flowing at a measurement node is measured and correlated with a predefined pattern, and a characteristic of the correlated signal is measured. Thus, power flow characteristics resulting from a group of one or more power flow devices can be remotely detected and measured.

10 Claims, 6 Drawing Sheets

(56) References Cited

U.S. PATENT DOCUMENTS

| | | |
|---|---|---|
| 2009/0177595 A1 | 7/2009 | Dunlap et al. |
| 2009/0224938 A1 | 9/2009 | Kopp et al. |
| 2009/0307178 A1* | 12/2009 | Kuhns et al. ............ 706/54 |
| 2010/0017249 A1* | 1/2010 | Fincham et al. .......... 705/8 |
| 2010/0235010 A1* | 9/2010 | Cooper et al. ............ 700/295 |

FOREIGN PATENT DOCUMENTS

| | | | |
|---|---|---|---|
| CN | 101482994 A | 7/2009 | |
| EP | 2 290 779 A1 | 3/2011 | |
| WO | WO2007/139587 | * 12/2007 | ............ G06Q 10/00 |
| WO | WO 2008/033514 A2 | 3/2008 | |
| WO | WO 2008/086114 A2 | 7/2008 | |
| WO | WO 2008/125697 | * 10/2008 | ............ H02J 3/14 |
| WO | WO 2008/141246 A2 | 11/2008 | |
| WO | 2009/052446 A2 | 4/2009 | |
| WO | WO 2009/045547 A1 | 4/2009 | |
| WO | WO 2009/063220 A2 | 5/2009 | |
| WO | WO 2009/145010 A1 | 12/2009 | |

OTHER PUBLICATIONS

U.K. Intellectual Property Office Search and Examination Report dated Mar. 11, 2010 issued in connection with a related UK Application No. GB1001397.7 (5 pages).

European Patent Office Communication (dated May 26, 2011) forwarding European Search Report dated May 17, 2011 issued in connection with a related EP Application No. EP11 15 2284 (5 pages).

\* cited by examiner

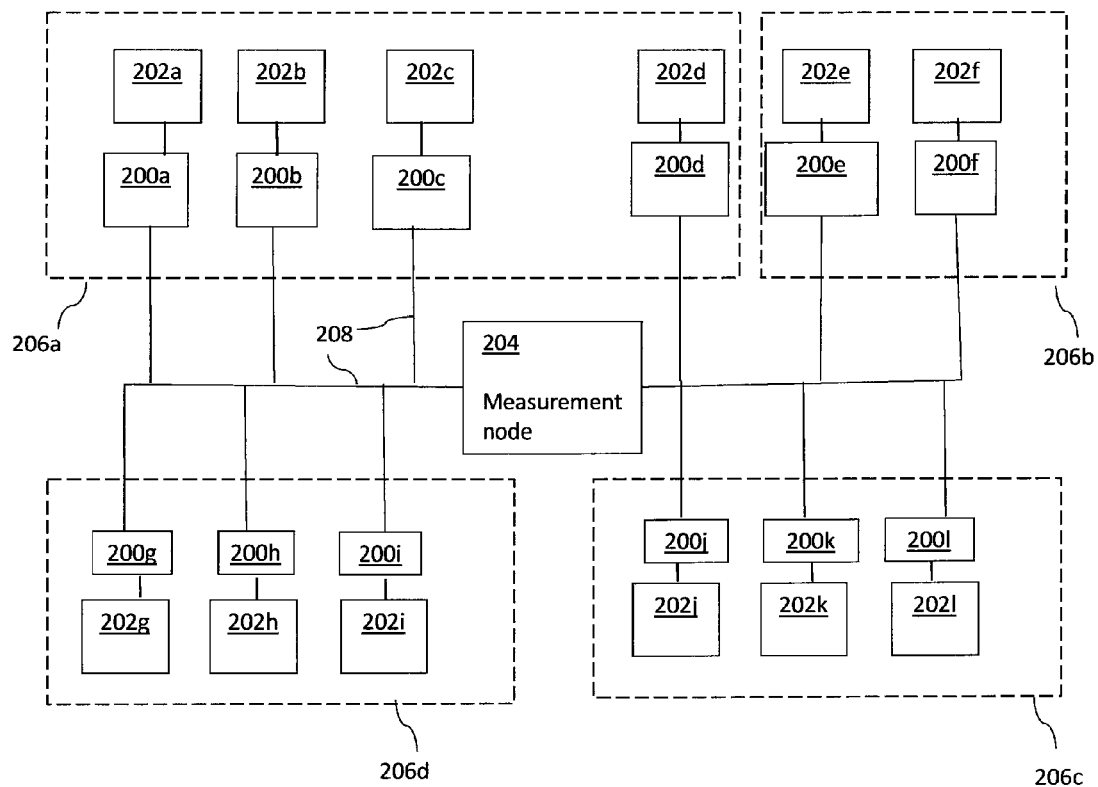

POWER FLOW MEASUREMENT AND MANAGEMENT

CROSS-REFERENCE TO RELATED APPLICATION

The present application claims priority under 35 USC 119 of UK Patent Application GB 1001397.7 filed Jan. 28, 2010, the entire disclosure of which is incorporated herein by reference.

FIELD OF THE INVENTION

The present invention relates to management of power flow in an electricity distribution network. In particular, but not exclusively, it relates to measurement of power consumption and provision by power units connected to the network.

BACKGROUND OF THE INVENTION

Supply of electricity from providers such as power stations, to consumers, such as domestic households and businesses, typically takes place via an electricity distribution network. FIG. 1 shows an exemplary distribution network comprising a transmission grid 100 and a distribution grid 102. The transmission grid is connected to generating plants 104, which may be nuclear plants or gas-fired plants, for example, from which it transmits large quantities of electrical energy at very high voltages (in the UK, for example, this is typically of the order of 204 kV; however this varies by country), using power lines such as overhead power lines, to the distribution grid 102; although, for conciseness, only one distribution grid 102 is shown here, in practice a typical transmission grid supplies power to multiple distribution grids. The transmission grid 100 is linked to the distribution grid 102 via a transformer node 106, which includes a transformer 106 which converts the electric supply to a lower voltage (in the UK, for example, this is typically of the order of 50 kV; however, this varies by country) for distribution in the distribution grid 102. The distribution grid in turn links, via substations 108 comprising further transformers for converting to still lower voltages, to local networks such as a city network 112 supplying domestic users 114, and to industrial consumers such as a factory 110. Smaller power providers such as wind farms 116 may also be connected to the distribution grid 116, and provide power thereto.

The total power consumption associated with a given network varies considerably from time to time; for example, peak consumption periods may occur during the hottest part of the day during summer, when many consumers use their air conditioning units. Since it is expensive to store electricity in large quantities, it is usually generated when it is required, which can place a burden on providers as they attempt to meet demand at peak times.

In recent years, there has been an increased demand for more efficient ways of managing power distribution in electricity networks; in particular it is desired to reduce wasteful electricity consumption in order to reduce costs and the adverse effect that some methods of electricity generation have on the environment. There is also a shift towards forms of power generation, such as wind power and solar power, which may only be able to supply power intermittently when conditions allow, increasing the need to reduce variation in power consumption with time. Furthermore, there is also a trend towards more distributed forms of power provision. For example, individual households and businesses are increasingly generating their own power, for example using solar panels installed on their premises; surplus power generated using these power sources may be sold back to the provider managing the network to which it is connected. Personal Electric Vehicles (PEV) are a further example of an electricity provider; PEVs typically have the capacity to store a large amount of electricity, and may be connected to an electricity network when they are stationary; this means that, in addition to being consumers of power, they can be used as a source of power for the network at times of high demand, with electricity stored in the battery of the PEV being fed back to the network at such times.

In order to meet these changing requirements, more sophisticated methods of measuring and controlling power consumption are desirable. More sophisticated networks, sometimes known as "smart grids", have been proposed, which may include may include features such as a capability to turn off certain household appliances or factory processes at times of peak demand. These smart grids may use sophisticated meters, sometimes known as "smart meters" capable of intermittently measuring power consumption in near real time, and of indicating energy prices to consumers; this information may be read manually, or it may be transmitted automatically over a communications network using, for example, TCP/IP technology, to a central location.

However such meters are typically located at the premises of a consumer or provider, and measure the amount of electrical power flow as a total of all devices located in the premises. This means that power flows relating to individual devices at a given premises, or a group of devices distributed across multiple premises, cannot easily be measured, particularly in view of the relatively high cost of smart meters making it prohibitive to install a separate meter at each power consuming and/or providing unit to be measured.

It is an object of the present invention to at least mitigate some of the problems of the prior art.

SUMMARY OF THE INVENTION

In accordance with a first aspect of the present invention, there is provided a method of controlling electricity power within an electricity distribution network, the electricity distribution network comprising a measurement node, the measurement node being configured to access a data store storing data indicative of one or more predefined power flow patterns, in which a power unit is electrically connected to the electricity distribution network and is configured to consume electric power from and/or provide electric power to the electricity distribution network such that a change in consumption and/or provision of electric power by the power unit results in a change in power flow in the network, the method comprising:

controlling power flow to and/or from the power unit in accordance with a control sequence, such that the consumption and/or provision of power by the power unit results in a power flow having a said predefined power flow pattern, and a characteristic of the power flow resulting from the unit is measurable by the measurement node.

By controlling the power flow at a power unit according to a predefined power flow pattern, a measurement node in a network to which the unit is connected having access to the pattern can detect and measure the power flow resulting from the power unit, allowing the power flow to be remotely detected and measured. Further, since the method requires only that power flow to and/or from a power unit be controlled (for example, switched on and off), it does not require complicated and expensive measuring equipment, such as a smart meter.

Preferably, the method comprises receiving the data sequence at the power flow control unit from the measurement node. The method may further comprise receiving an activation signal, and initiating the control sequence on the basis of the received activation signal. These features enable the power flow patterns of multiple power units to be controlled centrally from measurement node.

In some embodiments, the method comprises preventing power flow to and/or from the power unit in response to a deactivation signal. Thus, power units can be turned off centrally, allowing central control of power flow in the network.

In some embodiments, the method comprises measuring electric power consumption and/or provision at the power unit, and sending an indication of a said measurement to the measurement node. This enables measurement made at the measurement node to be calibrated using a local reading made at the device.

Preferably, each of a distributed group said power units is connected to the electricity distribution network, each of which having an associated said power flow control device, and the method comprises using the power flow control devices to control the power flow to and/or from the plurality of units in accordance with the control sequence, such that the consumption and/or provision of power by the plurality of power units is coordinated to collectively provide a power flow having the predefined power flow pattern and a characteristic measurable by the measurement node.

By providing a group of, perhaps distributed, power units with the same control sequence, so that they collectively provide a combined power flow according to the predefined pattern, the combined power flow resulting from the group can be measured.

In some embodiments, a plurality of the groups is connected to the network, and the method comprises controlling the power flow to and/or from each of the groups according to different control sequences, such that the power flow patterns resulting from said groups are mutually orthogonal, or quasi-orthogonal, such that a power flow characteristic associated with each of the power flow patterns can be measured at the measurement node independently of each of the other patterns.

By using orthogonal power flow patterns, power flow from multiple groups of devices can be measured simultaneously.

In accordance with a second aspect of the invention, there is provided a method of measuring power flow in an electricity distribution network comprising a measurement node, the electricity distribution network being connected to a group of one or more power units each configured to consume electricity from and/or provide electricity to the electricity distribution network such that a change in power provision and/or consumption by a said unit results in a change in power flow in the network, wherein each of the power units is associated with a respective power flow control device configured to control power flow to and/or from a power unit in accordance with a predefined control sequence, resulting in a power flow having a predefined pattern, the measurement node being configured to access a data store configured to store data indicative of one or more said patterns, the method comprising:

measuring a signal indicative of power flowing at the measurement node;

analysing the measured signal so as to correlate a component thereof with a said pattern, whereby to generate one or more correlated signals;

measuring a characteristic of one or more correlated signals, thereby determining a contribution to said measured signal by the group of power units.

This provides a convenient method of measuring a power flow resulting from a group one or more power units operated according to the first aspect of the invention.

Preferably, the predefined power flow pattern comprises a repeating pattern, and the power flow control devices are configured to controlling power to and/or from the group of one or more power units continuously according to the repeating pattern. The method of the present invention allows continuous measurement of power consumption of a power unit, in contrast to prior art methods, which generally provide only intermittent measurement.

Preferably, the method comprises allocating the control sequence in accordance with a power consumption and/or provision requirement relating to the one or more power units, whereby to control an energy consumption and/or provision of the power units. The method can be conveniently employed to control energy consumption and/or provision by a power unit simultaneously with allowing continuous measurement.

In accordance with a third aspect of the invention, there is provided a method of controlling electricity flow in an electricity distribution network, the electricity distribution network comprising a plurality of measurement nodes and a plurality of distributed groups of power units, each of said power units being configured to consume and/or provide electricity associated with the electricity distribution network, wherein each power unit in a given group is configured to be controlled by a control sequence assigned to the group, the control sequence controlling power consumption and/or provision by each unit of the group according to a predefined pattern, resulting in an associated power flow pattern, and each of the measurement nodes being configured to measure a characteristic of power flowing in the network associated with the power consumption and/or provision of one or more groups, the method comprising:

assigning a plurality of said control sequences to a first plurality of groups of units, such that a characteristic of power flow associated with the first plurality of groups is measurable by a first said measurement node, wherein the assigned control sequences result in mutually orthogonal patterns of power flow, whereby flow characteristics associated with each of the power flow patterns can be measured at the first node independently of each of the other patterns;

assigning a further control sequence to a further, different, group of units, such that a characteristic of modulated power flow associated with the further group of units is measurable by a further, different, measurement node; and controlling consumption or provision of power in the network in accordance with the assigned control sequences, wherein the further control sequence corresponding to a control sequence assigned to the first plurality of groups.

Thus, according to this aspect of the invention, orthogonal codes can be re-used between different measurement nodes.

In accordance with a fourth aspect of the present invention, there is provided a method of controlling electricity flow within an electricity distribution network, the electricity distribution network comprising an measurement node and a plurality of power units, each of the power units being configured to consume and/or provide electricity associated with the electricity distribution network, wherein each of the power units is configured to be controlled by an assigned control sequence, the control sequence controlling power consumption and/or provision by the unit according to a predefined pattern, the method comprising;

assigning group membership to a plurality of the units, thereby defining at least one group; and assigning a said control sequence to the group, such that each unit of the group consumes and/or provides power in accordance with a predefined pattern corresponding to the assigned control sequence, resulting in a modulated power flow pattern having a characteristic measurable at the measurement node, the method further comprising:

measuring a characteristic of the modulated power flow pattern at the measurement node;

based on the measured characteristic and one or more predefined optimisation parameters, modifying the assigned group membership; and iterating said measurement and modification, whereby to optimise a measured characteristic associated with the group.

This provides a convenient method of defining groups for use in measurement methods according to aspects of the present invention; by iterating the measurement and modification steps, it can be assured that groups having appropriate characteristics are defined.

In some embodiments, the network comprises a plurality of geographical areas each associated with a said node, and in which each unit located in a given said geographical area is associated with the node associated with that area. In some embodiments one or more of the units is capable of moving between the geographical areas, and the method comprises:

monitoring a location of one or more of the units;

determining that one or more units have entered a given geographical area;

in response to said determination, associating the one or more units with a node associated with the given area;

analysing group membership and associated modulated power flows in the given area; and assigning group membership to the one or more units that have entered the given geographical area on the basis of the analysis.

This allows the group assignment to take account of the movement of power units, and update group membership accordingly.

Further features and advantages of the invention will become apparent from the following description of preferred embodiments of the invention, given by way of example only, which is made with reference to the accompanying drawings.

BRIEF DESCRIPTION OF THE DRAWINGS

FIG. 2 shows a network comprising a measurement node and groups of power units, in accordance with an embodiment of the present invention;

DETAILED DESCRIPTION OF THE INVENTION

Figure 1:
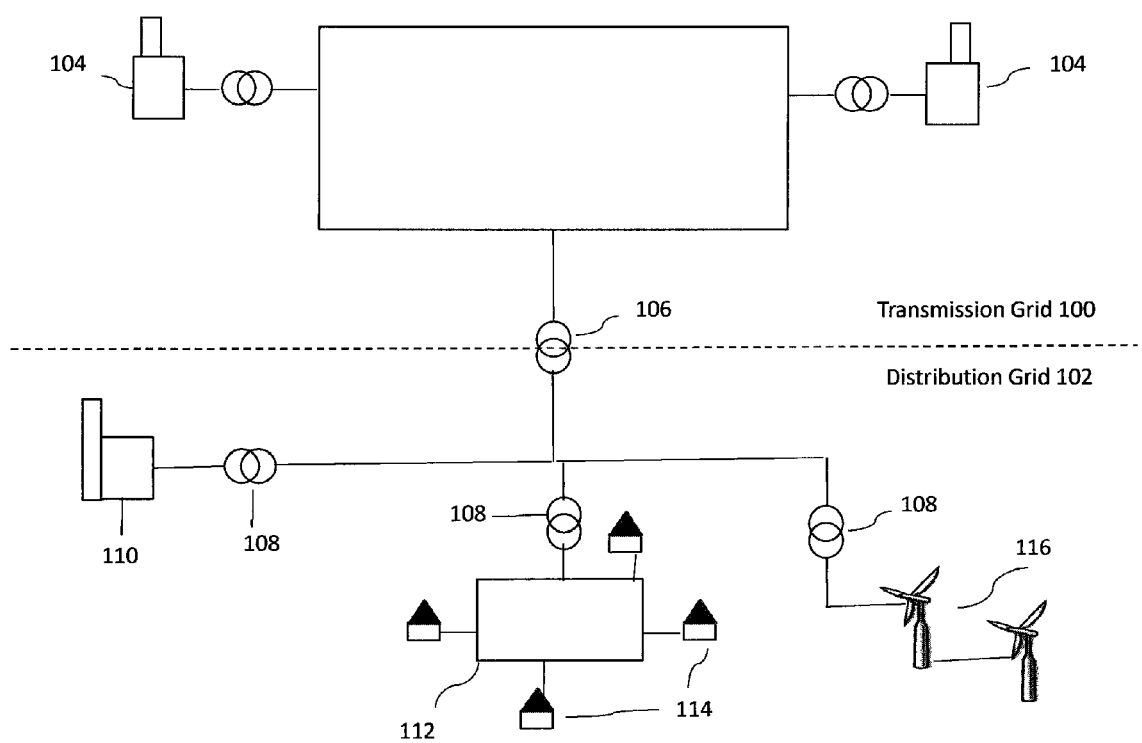
FIG. 1 shows a prior art electricity distribution network.

FIG. 2 illustrates an electricity distribution network in which an embodiment of the present invention may be implemented. The network comprises a measurement node 204 which is connected via power lines 208 to power units 202a to 202l via power flow control devices 200a to 200l. Each of the power units 202a to 202l consumes and/or provides electric power. Examples of power units consuming electric power include domestic appliances such as electric water heaters and washing machines, as well as industrial devices, such as factory machinery and desktop computers. Examples of providers of electric power include solar panels and wind-turbines. Still other power units may consume electric power at some times but provide it at others, such as the PEVs described above. Further, the term power unit is used herein to include collections of such appliances and devices, such as a house. Each of the power units is associated with a power flow control device 200a to 200l, which controls transfer (i.e. provision and/or consumption) of power by the associated power unit; a power flow control device 200 is described in more detail below.

The measurement node 204 may be located at the transformer node 106 described above, which links a transmission grid with a distribution grid; alternatively, it may be located at a substation 108 in the distribution grid, or at any other location of the electricity distribution network convenient for interacting with power units as described herein.

Although, for the sake of simplicity, only twelve power units are shown in FIG. 1, it will be understood that, in practice, the network will typically comprise many hundreds or thousands of such devices.

Further, the power units and associated power flow control devices are divided into groups 206a to 206d. As shown, the grouping need not contain equal numbers of member devices; further, the grouping need not take account of geographical location, and may be highly distributed. Further, the grouping need not take account of power unit type; for example, some groups may include both providers and consumers of electric power. Some groups may only have a single member.

In some embodiments of the present invention, membership of a group is not fixed, but can be varied with time to meet requirements, as is described in more detail below.

Power flow control devices 200a to 200l each modify the power flow to and/or from respective associated power unit 202a to 202l, according to a pattern which is uniquely defined for each group 206a to 206d. Representations of these patterns are also stored at the measurement node 204. The modified power flow propagates through the power lines 208 in the network in the form of an electric power signal (EPS); these EPSs may be thought of as waves having a waveform corresponding to the pattern used for the group, each group 206a to 206d having a uniquely associated waveform.

Figure 4:
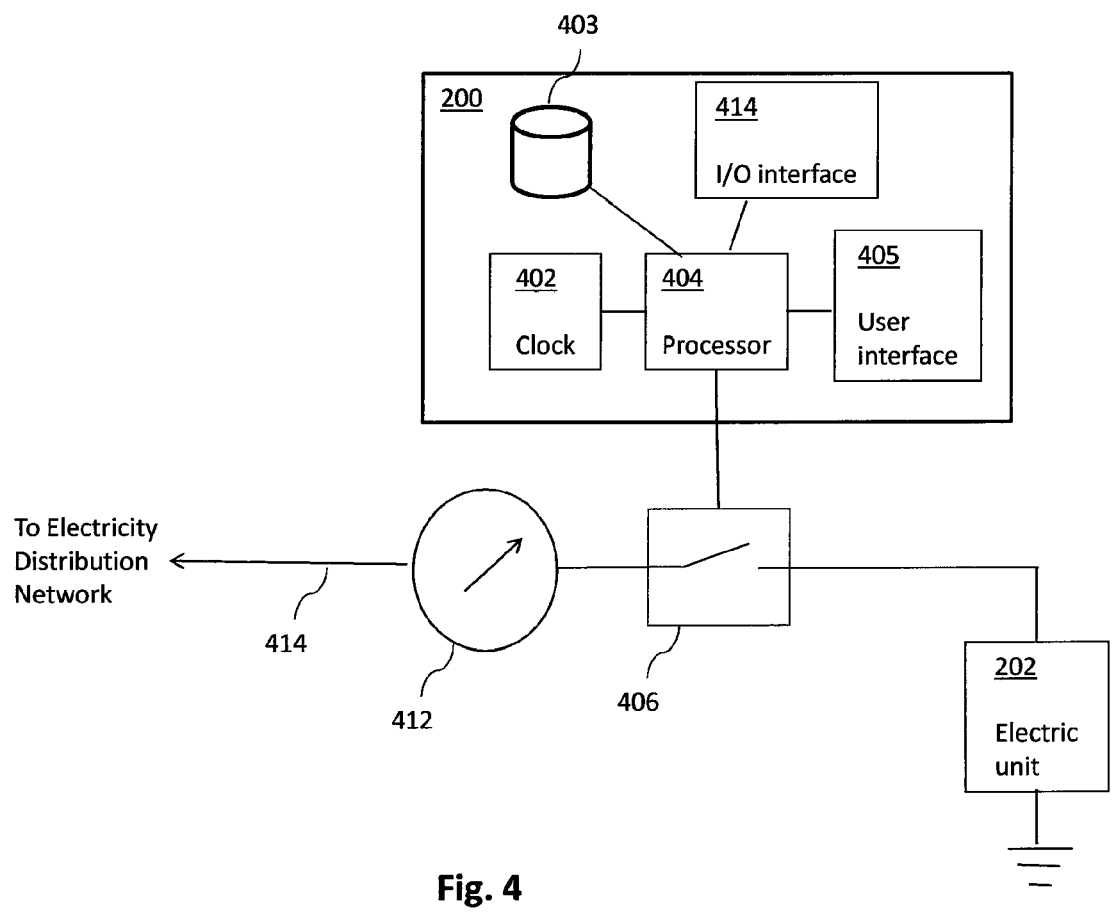
FIG. 4 shows an arrangement including a power flow control device in accordance with an embodiment of the present invention.

An exemplary arrangement for modifying the power transfer of (i.e. the power consumed or produced by) a power unit as described above is now described with reference to FIG. 4. FIG. 4 shows an exemplary power unit 202 of FIG. 2 which consumes electricity provided along power lines 208 connected to an electricity distribution network. In accordance with an embodiment of the present invention, a power flow control device 200 is arranged to send signals to a switch 406 which controls the supply of power to the power unit 202. The power flow control device 200 comprises a clock 402, a data store 403, a processor 404, a user interface 405 and a communications interface 410 arranged to receive transmit and receive information via a fixed or wireless communications means, such as ADSL, GSM, 3G etc.; functions of these components are described in detail below. A power meter 412 may also be provided which is arranged to measure the power consumption at the power unit 202; a use of this power meter is described below.

Although the power flow control device 200 is shown here as a separate device to the power unit 202, in some cases it may comprise an integrated part of the latter; further the switch 406 is not necessarily located exterior to the power unit 202, but may instead be installed in the unit, and be arranged to control power supply from the interior of the device; this latter case is advantageous where the power unit may move from location to location, for example if the power unit is a PEV.

The data store 403 of the power flow control device 200 stores one or more control sequences (referred to herein as "codes") representing control signals for controlling the switch according to a predefined pattern. The processor 404 accesses the data store 403, retrieves a code and, based on the code, sends control signals to the switch 406 for controlling the flow of power to the power unit 202. The code typically defines a time-varying pattern of control signals, in this case the signals are provided with reference to the clock 402.

It should be noted that, although the codes are described above as being stored in the data store 403 of the power flow control device 200, in some embodiments they may be stored remotely, with the device 200 accessing the remote store to receive the codes when required. In some embodiments, the codes may be transmitted to the device 200, for example from the measurement node 204, in which case they may not be stored at the device 200, or stored only in a temporary data store.

The switch may comprise a simple relay device which turns power supply on- and off-periods at specific time instants. Alternatively or additionally, the switch 406 may comprise an attenuator or a phase inverter, etc. used to obtain a unique waveform not necessarily including simply on- and off-periods. The codes stored in the power flow control device may be prescribed in the configuration of the power flow control device 200 when the power flow control device 200 is set up, or it may be communicated to the power flow control device 200 via the communications interface 410; further details on the latter arrangement are provided below.

The action of the switch 406 thus provides an EPS which propagates through the power lines 414 to the electricity distribution network, and whose amplitude depends on the power consumption of the power unit 202. In embodiments of the present invention, groups of one or more power flow control devices are each assigned a common code and thereby coordinated such that a combined EPS results which can be arranged to be of a size sufficient to be detected at the measurement node 204. The EPSs generated by each group of power units propagates through the network to the measurement node 204, thereby modifying the total power flow at the measurement node. Since the pattern by which the EPS was generated is known by the measurement node 204, the measurement node 204 can identify a given group by detecting the EPS associated with a known pattern, and analysing it to filter out the contribution to the total power flow by the given group, thereby determining the contribution to the total power flow by the given group.

Although the power unit 202 has been described as consuming power provided by the electricity distribution network, it will be understood that the above described processes apply equally in the case that the device is a provider of electrical power.

Figure 5:
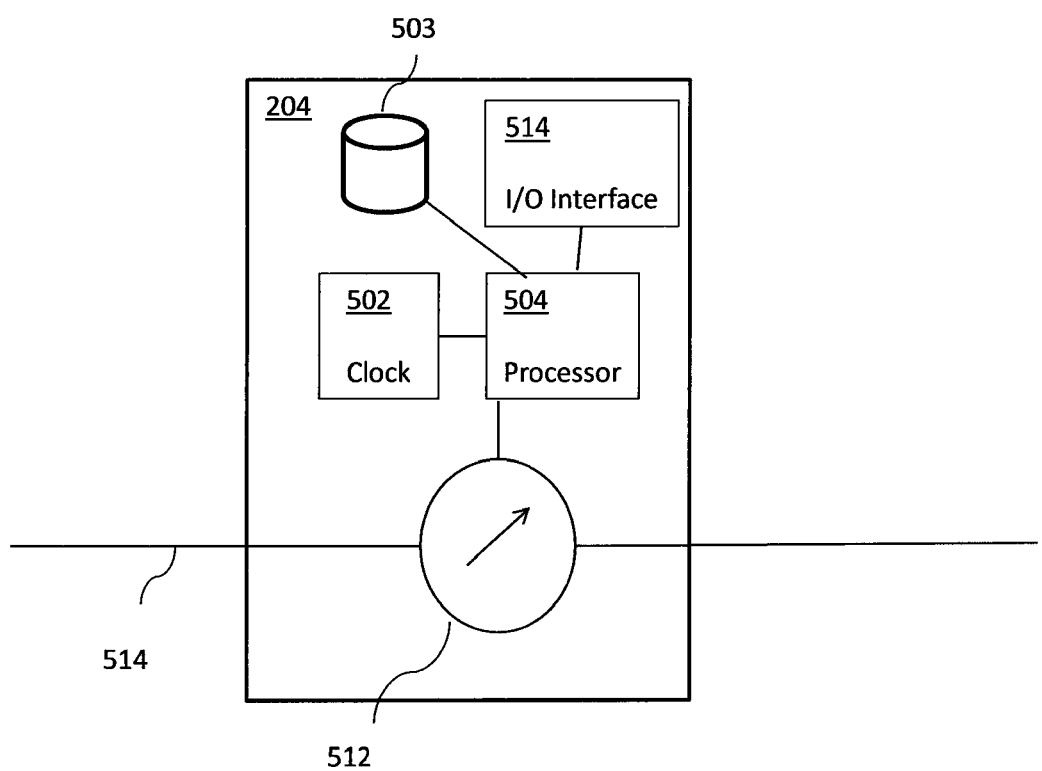
FIG. 5 shows a measurement node in accordance with an embodiment of the present invention.

FIG. 5 shows an exemplary measurement node 204. The node 204 comprises a processor 504, a data store 503, a clock 502, a communications interface 510 and a power meter 512 arranged to measure the power flow through power lines 514 located at the node 204. The data store 503 stores one or more codes, corresponding to those stored in the data store 403 of the power flow control device 200, along with information relating to the group associated with each code. For example, the data store may contain an identifier of each of the power units belonging to each group, along with an address, such as IP address, of each device associated with a group; use of this address data is described below.

The meter 512 may be an integrated component of the node 204, or may be in remote communication therewith. It may be implemented as a coil wrapped around a power line. Typically, the meter 512 senses temporal variations in the power flow.

The node processor 504 receives data from the meter 512 indicative of the amplitude, or some other characteristic of power flow at the node 204. The processor 504 typically includes an analogue to digital converter which converts the received signal to digital data. The processor then filters this data, using one or more of the codes stored in the data store 502 and timing data from the clock 502, to correlate the received signal and identify one or more groups of power units, and to determine a power flow amplitude at the node 204 resulting from each identified group.

As mentioned above, the power flow control devices 200 may also communicate with a power meter 412 local to the power units 202 with which they are associated. These local power meters 412 may be used to provide a local reading of power flow in relation to the device, which may be communicated to the measurement node 204 e.g. via wireless or fixed line telecommunications mean in order to calibrate readings made at the measurement node 204.

In some arrangements, only a single group is associated with a given measurement node 204. However, typically multiple groups will be associated with each node. In the latter case, and to enable the contribution to the power flow at the measurement to be distinguished from a given group can be distinguished from the contribution from other groups, it is useful for the codes to define patterns of control signals that are orthogonal or quasi-orthogonal, and result in orthogonal or quasi-orthogonal EPSs; that is, a respective pattern associated with a given group is not correlated with patterns associated with other groups, or is only very weakly correlated therewith.

Techniques for distinguishing power flows from different groups are now described with reference to FIGS. 3A to 3C, which show exemplary techniques that may be used to distinguish the power flow patterns of different groups. As mentioned above, the groups are preferably assigned mutually orthogonal codes so that activity in respect of one group does not interfere with activity in respect of another group. The codes can be orthogonal in frequency, time, code or a combination thereof. In practice this may lead to the use of frequency separation, time division separation, or code division separation of the groups, or a combination thereof. The measurement node 204 is accordingly tuned, synchronized, matched, correlated, etc. to the code in order to identify the group providing/consuming energy. The measurement node may further measure the power amplitude of the load of the group.

Figure 3A:
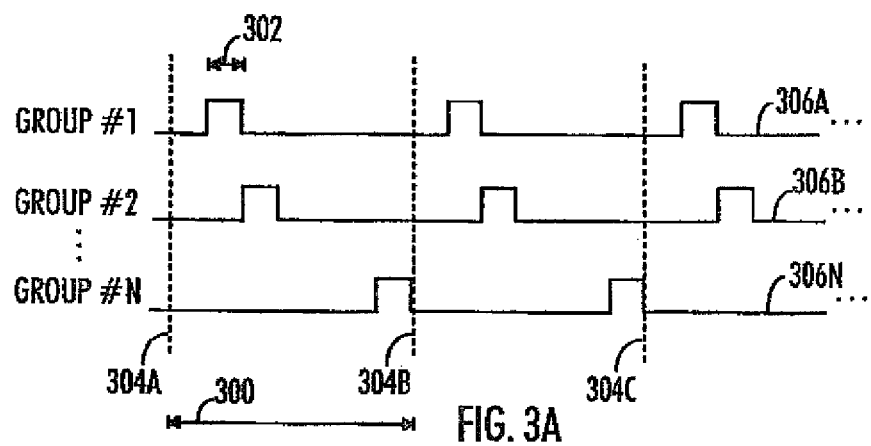
FIG. 3A shows a first type of repeating power flow patterns in accordance with an embodiment of the present invention.

FIG. 3A shows an example of N groups where the codes are arranged according to a pattern of discrete power level transitions which repeats with a predefined time period 300. If the on-state is denoted as "1" and the off-state denoted "0", the switching pattern during one cycle of the waveform 306A for the group #1 is "0100000", whereas for the waveforms 306B and 306N the corresponding orthogonal switching patterns are "0010000" and "0000001" respectively. For the sake of clarity, the waveform cycles are demarcated with vertical dashed lines 304A to 304C. It is clear that as the switching patterns are orthogonal between each other, and they allow identification of the groups.

Although each of the codes shown in Figure A comprise a single "on" time slot, it should be noted, however, that one or more of the codes may have a plurality of on-states during the cycle 300. The pattern for a specific group may be "011101001", for example.

The measurement node 204 may in this case comprise a correlator for disambiguating signals from, and thus identifying, the groups. This may be done by comparing each of the group-specific patterns known to the measurement node with the waveform of the EPS detected by the processor 504 and determining which of the possible group-specific patterns results in the highest correlation with the detected waveform. The processor 504 subsequently identifies the group assigned to use the pattern that resulted in the highest correlation. In other words, the measurement node 204 correlates the detected waveform with a plurality of orthogonal waveforms for identifying the group providing and/or consuming electric power, on the basis of the group-specific switching pattern. This method, described with reference to FIG. 3A, may be referred to as code separation of the groups.

The measurement node 204 may also measure the amplitude of the groups, and add the measured amplitudes together to obtain a sum of controlled power usage/consumption in the given controlled groups.

Figure 3B:
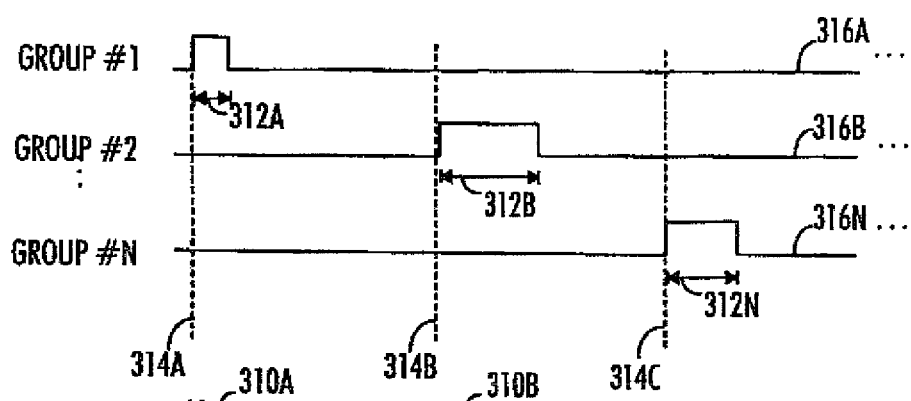
FIG. 3B shows a second type of repeating power flow patterns in accordance with an embodiment of the present invention.
Figure 3C:
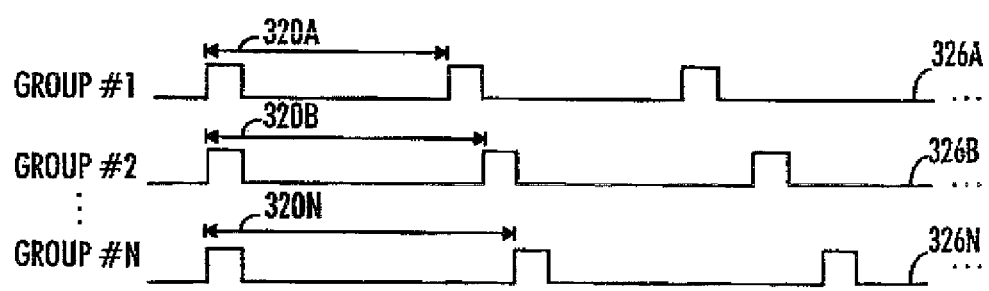
FIG. 3C shows a third type of repeating power flow patterns in accordance with an embodiment of the present invention.

FIG. 3B shows an example where the groups are identified with a group-specific time window for switching the electric power to/from the electric power transmission network. That is, each group is assigned a specific time window 310A to 310B during which the associated switches are switched into the "on" state; these time windows are demarcated with vertical dashed lines 314A to 314C. In FIG. 3B, the group #1 is determined to provide/consume energy only during the time window 310A. The duration within the assigned period during which the specific group provides/consumes energy may be specified as well. As can be seen from FIG. 3B the duration 312A to 312N of each waveform 316A to 316N, respectively, may vary. Nevertheless, the activity takes place during the specified time window 310A to 310B. That is, the load may be switched on during the whole or a certain fraction of a time window. This method, described with reference to figure B, may be referred to as time slot separation of the groups.

A further technique for identifying groups from associated EPSs will now be described with reference to FIG. 3C. This technique applies switching in distinct group-specific frequencies. That is, each group is specified with a distinct frequency according to which the group consumes/provides electric power. For example, group #1 transfers energy in intervals of a period 320A, group #2 transfers energy in intervals of a period 320B, and group #N transfers energy in intervals of a period 320N. The intervals 320A to 320N are different for each group and therefore the waveforms 326A to 326N may be identified at the measurement node as being associated with a certain group. This method may be referred to as frequency separation of the groups.

In the frequency separation method, the processor 504 may conveniently comprise a Phase Locked Loop (PLL) amplifier with a plurality of base frequencies for filtering. The processor 504 may perform a Fourier or a wavelet analysis in order to obtain the total power associated with the group. Also, the duration for transferring energy may be varied between groups and also between different on-periods of one group. This way, the load can be controlled by varying the ratio of the on/off-states from low to high The above descriptions made with reference to FIGS. 3A to 3C provide examples of orthogonal switching patterns. Other types of orthogonal patterns can be created by combining the frequency, time slot and code separation methods described above. Irrespective of the way in which power usage of one group is distinguished for that of another group, the power flow pattern detected at the measurement node 204 is compared with patterns stored at the measurement node, and the group from which the detected power flow pattern results identified on the basis of this comparison.

By designing the codes appropriately, it is possible to measure power consumption/provision continuously, rather than intermittently, and monitor these measurements in real time. That is, a power flow control device 200 may control a power unit 202 according to a continuously repeating code or series of codes. The codes can be designed to manipulate the proportion of time that power is supplied to/from the power unit 202, and/or the amount of attenuation of the power supply, so that the total energy consumption over a given period can be managed at an acceptable or desired level. The time slot separation method and frequency separation methods described above are particularly advantageous in relation to this aspect of the invention.

For example, it may be acceptable for a domestic air conditioner to be continuously running at only 80% power, without any undesirable consequences for the performance of the heater. In this case the codes can be designed so that the power flow control device 200 switches off the power supply to the air conditioner for 20% of the time, with power being supplied for the rest of the time, so that the total energy consumption over a given period is 80% of the maximum.

In some cases, the code used may vary from time to time, such that the power consumption is turned on for a higher proportion of the time at some times than at other times. This adjustment could be made on the basis of user demand, for example a user may require their air conditioner to consume more power at some times than at others, or on the basis of network conditions, for example switching to a code resulting in lower total power consumption when it is desired to relieve demand on the network.

As mentioned above, in the case that a group comprises more than one power unit 202, it is advantageous for each power flow control device 200 of the group to be configured with the same code i.e. the processor 404 of each power flow control device 200 to use the same code to control the switch 406. In the case that a group includes both power providers and power consumers, the power flow control devices may be arranged such that the switching of the providers occurs in antiphase to that of the consumers so that, for example, when the consumers are turned on, the providers are turned off, and vice versa. This ensures that a power flow amplitude indicative of the total contribution of the group is produced.

In order that the resulting EPS from each member of the group constructively combines with the EPS from the other members, the use of the codes may be synchronised i.e. the processor 404 of each group member should activate the code in coordination (e.g. simultaneously) with the other members of the group. This could be achieved in a number of ways; for example, the clocks of each power flow control device 200 could be synchronised, and the devices 200 configured to activate the code at a predetermined time. However, in the case of code separation of the codes described above, the use of the codes is not necessarily synchronised; instead, the power flow control devices 204 of the group may activate a given code at different times with the processor 504 of the measurement node 204 being arranged to correlate different instances of the pattern of power flow corresponding to the code resulting at different times from different power units 202, and to sum up the contributions from the different power units 202.

Activation of the code may be triggered by an activation signal communicated to the control devices 200 via the communications interface 410; the activation code could be transmitted to the devices 200 from the measurement node 204, or from some other location. The activation signal may trigger immediate activation of a code, or it may specify a time at which the code is to be activated. The activation signal may specify a duration of activation of the code.

In some embodiments of the present invention, more than one measurement node 204 is used to detect power flow patterns. Each measurement node 204 may be assigned a defined geographical area, with all power units 202 in a given area being associated with the node for that area. Since the EPSs attenuate as they travel through the network, the EPS resulting from a group whose member devices are located in an area associated with a given node 204 will typically be considerably weaker at other nodes. This means that, provided the groups are arranged such that the EPS is not so large as to interfere with signals in neighbouring areas, it is possible to use the same or corresponding codes for groups located in different areas associated with different measurement nodes; that is, a set of non-orthogonal code combinations can be re-used between the different areas.

It is desirable to define groups such that the resulting EPS produces a power flow at the measurement node 204 which is large enough to be distinguished from other components making up the total power flow at the node 204, and is detectable above the noise of the power meter 512 etc. However, there may also be considerations due to which it is desirable that the power flow contribution from the group is not too large; for example, it may be desirable to prevent the power flow contribution from becoming so large that it interferes with readings made on measurement nodes 204 with which the group is not associated. There may also be regulations associated with the network limiting the maximum amount of switching that is allowable. A further factor is the length of time over which the measurement is to be taken i.e. the time period over which the code sequence is to be activated; a short activation time requires a relatively large power flow amplitude in order to be detectable, whereas if the activation time is long, a relatively small power flow amplitude may be sufficient.

An exemplary process for allocating power flow control devices 200 to a group will now be described. In the following examples, the code allocation is performed at the measurement node 204; however, in some embodiments, this allocation and/or transmission is performed by a further device, with which the node and the devices communicate via their respective interfaces 410, 510.

In some embodiments, the power flow control devices 200 are each registered with a measurement node 204. This registration could be performed manually, for example via the user interface 405 of the node, and may involve the power flow control device 200 sending a signal via the communications interface 410; to this end, the power flow control device 200 may have access to an IP address, or other network address of the measurement node 204. Unit information indicative of characteristics of the power unit 202 with which the power flow control device is associated may also be provided; for example, a user may manually enter that the power unit being controlled is a water heater, or enter an expected power consumption of the power unit. Other unit information that may be provided includes intervals when the associated power unit 202 is available for measurement, and/or control without adverse interference to the normal functioning of the device. If the user subsequently decides to opt the power unit 202 out of measurement, either permanently or temporarily, this information may also be transmitted to the measurement node. When received by the measurement node 204, such unit information is stored in the data store 503.

It should be noted that although unit information and other data is described above as being stored in a data store 503 located at the measurement node 204, in some cases it may be stored in one or more remote data stores to which the node 204 has access.

Figure 6:
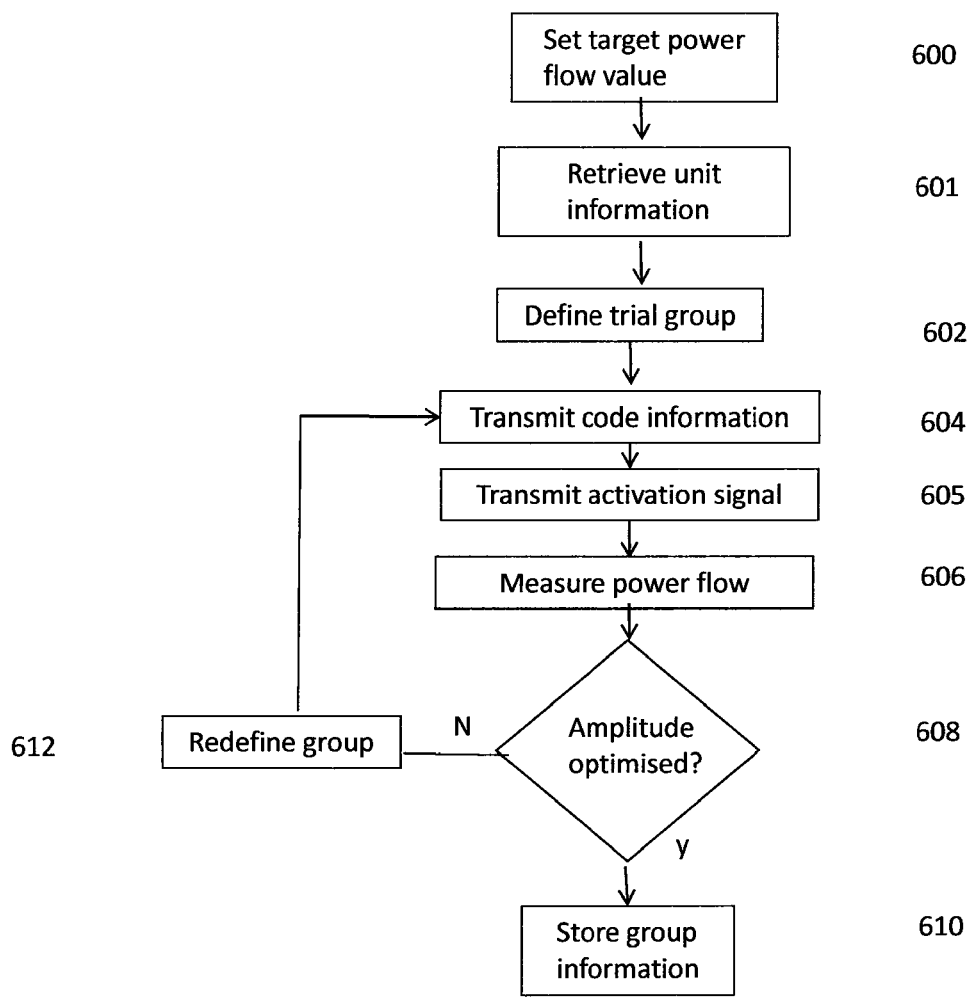
FIG. 6 is a flow diagram showing steps in assigning groups of power flow control units in accordance with an embodiment of the present invention.

FIG. 6 is a flow diagram showing a process by which power units are allocated to a group. At step 600, a target is set for the power flow value at the measurement node 204 resulting from the EPS from the group, based on the factors such as signal to noise ratio etc. described above. At step 601 the processor 504 of the measurement node retrieves unit information from the data store 503. This unit information is used at step 602 to define a trial group based on e.g. the number of units selected for the group and/or expected power consumption/provision of the selected units.

At step 604 a code is allocated to the group and code information is sent, using the address data mentioned above, to the selected power flow control devices 200 via the communication interface 510 of measurement node. The code information may contain the code itself, or may provide an indication of a code stored in the database 403. At step 605 an activation signal, as described above is similarly transmitted to the selected devices; in some embodiments, the code information is sent concurrently with the activation signal.

At step 606 the power flow resulting from the thus define group is measured. It may be that the power flow is different to the expected value because, for example, one or more of the devices is not active (e.g. a solar panel at night) or because the unit information stored in the data store 503 is not accurate, for example.

At step 608, it is determined whether the measured power flow amplitude satisfies certain predefined constraints, such as whether the measured amplitude is within an acceptable range. If the power flow amplitude is determined to be within the range it may be considered optimised, and the information relating to the group so defined and the code allocated to the group is stored in the data store 503 of the measurement node 204 at step 610.

If at step 608 the amplitude is determined not to be within the range, the process proceeds to step 612 where the group is redefined; in other words group membership of the trial group is altered. After the group has been redefined, the process returns to step 604 and sends out code information to the selected power flow control devices 200 in the redefined group. Steps 646 to 608 are then repeated iteratively until an optimised group is obtained.

The redefining step 612 may be performed on the basis of the unit information mentioned above; for example, a shortfall in the size of the measured amplitude may be compensated for by including power units 202 having an expected power consumption/provision totalling this shortfall. Alternatively or additionally a random allocation technique may be employed. For example, a number of units 202 for inclusion in the group may be selected based on the unit information, and the devices making up that number then selected at random. Alternatively, in some embodiments, both the number and the identify of units 202 may be selected at random with steps 604 to 612 being performed iteratively until an optimised amplitude is obtained.

In some embodiments, a random allocation technique as described above could used for each iteration of the above process, in which case the unit information is not used in the group allocation process.

The above-described methods of defining groups are not exhaustive; any method resulting in groups having the desired characteristics may be used.

As mentioned above, some power flow control devices 200 may be associated with power units 202 whose location changes from time to time, for example a PEV, which may change location permanently when its owner moves house, or temporarily when the owner for example, goes on a day trip and parks in an area different to its usual location. Even when the PEV has only changed locations temporarily, it may be connected to the electricity distribution network at the temporary location, for example to recharge a depleted battery.

When a PEV changes location, it may move from an area associated with a first measurement node and into a different area, specifically one associated with a node other than the first node. This other node could be associated with the same network operator as the first node, or it could be associated with a different network operator. It may be convenient to communicate this change of location to the measurement nodes affected. The PEV may be fitted with a Global Positioning System (GPS) navigation system which monitors the position of the PEV and transmits this position information. In some embodiments, the position information is transmitted directly to each measurement node 204, with each node receiving this information then determining whether the PEV is within its zone; in some embodiments, the PEV transmits the information to a master node which then assigns the PEV to a node into whose allocated area the PEV is located. To this end, the PEV may store data indicative of a network address, such as an IP address, of each node 204 with which it communicates. In some embodiments, the location information may be input manually by a user using the user interface.

The area in which the PEV is located may be determined on the basis of input from the user, for example, the user of the PEV can use the user interface 405 to indicate (e.g. to the master node mentioned above) that the PEV has changed location. A code is then assigned to the PEV for activation over a time period long enough that the resulting EPS can be detected at one or more measurement nodes 204. It is then determined at which measurement node 204 the EPS is strongest, and the PEV is assigned to that measurement node 204.

The movement of the PEV between areas may necessitate a reallocation of codes, both in the area into which it has moved and in the area it has left. For example, the master node mentioned above may monitor changes of area, and transmit a signal to the first node indicating that the PEV is no longer associated with the first node, and a further signal to the other node, indicating that the PEV is now assigned to that node.

If only a single PEV moves into a given area, it may be that it can be allocated to an existing group without significant disruption to the EPS of the group. Similarly, the PEV may simply be removed from the group to which it was assigned in the area it has left without having to make a change to this group, if this does not have too large an impact on the EPS from the group. However, where the number of PEVs changing areas is large, the movement may disrupt the EPS to an extent that the group allocations have to be altered; the power flow amplitudes resulting from the different groups may be monitored, with the groups being reallocated in the case that a power flow amplitude for any group is outside of an acceptable range, for example. The group reallocation process may involve repeating the process described with reference to FIG. 6.

The above processes provide a method for remotely measuring power consumption and/or provision by one or a group of electric devices in real time, and allowing real time monitoring of the measurement. This clearly has wide application in the field of power management; for example, it could be used to provide real time information on power available to be fed back into the network from one or more PEVs plugged in to a charging station and, for example, or to provide a real-time measurement of the power consumption of an individual device, such as an electric oven or a household immersion heater.

As regards users associated with the power units 202 being measured, it is implicit that, for their power units to be controlled according to embodiments of the invention, they agree to enter into a scheme by which, in the case of electric power providers, surplus power can be fed back into the electricity distribution network and, in the case of electric power consumers, the devices may be remotely turned off. This may be implemented, by, for example, a disabling signal from the measurement node 204, or from some other location, at certain times of day, especially in the case of for example, air conditioners and water heaters, which may not be used at specific times of day. The energy saving thus generated could then be made available to a utility responsible for providing power in the electricity distribution network.

Thus, an available power may be measured for a given group according to the above described methods; and the measured amount offered for sale to the utility provider. If the utility provider agrees to the purchase, the measurement node may transmit a signal to the power flow control devices 200 of the relevant group causing all the electricity consuming devices of the group to be switched off, and all electricity providing devices to be switched on.

As described above, the user may specify, using the user interface 405, a time during which it is acceptable for the power unit 202 to be turned off. Further, in the case of a PEV moved to a new location, the user may provide information such as an indication of the length of time the PEV is to be located at that location, the amount of available charge in the battery.

Information regarding the location of one or more power units may also be used to, for example, monitor network power consumption/provision in particular localities of the network in order to ensure that "hot spots" of excessive power demand do not occur.

The techniques and methods described herein may be implemented by various means. For example, these techniques may be implemented in hardware (one or more devices), firmware (one or more devices), software (one or more modules), or combinations thereof. For a hardware implementation, the apparatuses of FIGS. 4 and 5 may be implemented within one or more application-specific integrated circuits (ASICs), digital signal processors (DSPs), digital signal processing devices (DSPDs), programmable logic devices (PLDs), field programmable gate arrays (FPGAs), processors, controllers, micro-controllers, microprocessors, other electronic units designed to perform the functions described herein, or a combination thereof. For firmware or software, the implementation can be carried out through modules of at least one chip set (e.g., procedures, functions, and so on) that perform the functions described herein. The software codes may be stored in a data store unit and executed by processors. The data store unit may be implemented within the processor or externally to the processor. In the latter case it can be communicatively coupled to the processor via various means, as is known in the art. Additionally, the components of the systems described herein may be rearranged and/or complemented by additional components in order to facilitate the achieving of the various aspects, etc., described with regard thereto, and they are not limited to the precise configurations set forth in the given figures, as will be appreciated by one skilled in the art.

The above embodiments are to be understood as illustrative examples of the invention. Further embodiments of the invention are envisaged. For example, it is described above that a user may interact with, and provide information to, the measurement node 204 via a user interface 405 of a power unit 202; however, in some arrangements the user may instead interact with the node 204 using a user interface located elsewhere, or use an internet browser to communicate with the measurement node 204 via the internet. In some arrangements, the communication described as being performed by a user could instead be performed automatically, for example using a computer algorithm which could be adapted to access the users calendar, and/or other personal information to determine available times of devices associated with the user, for example.

Further, it was mentioned above that a measurement node 204 may store address data indicating a network address, such as IP address, of one or more power flow control devices 200 with which it communicates. In some embodiments, the power flow control unit 200 may be fitted with a subscriber identity module SIM card, in which case the address data comprises an identity number of the SIM card, such as an MSISDN number. In some cases communications between power flow control devices 200 and measurement nodes 204 may take place by transmission of data along the power lines 414.

In many of the above examples, it is described that the measurement node measures an amplitude of power consumption; however, in some cases, some other characteristic of the power flow could be modified by the flow control devices and consequently characterised at the measurement node; for example, complex impedance of the power units could be used to modify the power flow.

Further, in the embodiments discussed above, the electric distribution network uses a single phase distribution. However, it will be clear to the skilled person that the same principles apply to multi-phase systems; for example, in a three phase system, the measurement node sums the contribution for each group for each phase and then sums over all the phases.

It is to be understood that any feature described in relation to any one embodiment may be used alone, or in combination with other features described, and may also be used in combination with one or more features of any other of the embodiments, or any combination of any other of the embodiments. Furthermore, equivalents and modifications not described above may also be employed without departing from the scope of the invention, which is defined in the accompanying claims.

Numbered Clauses:

The following clauses form a part of the present disclosure and describe embodiments of the present invention.

A method of controlling power flow within an electricity distribution network, the electricity distribution network comprising a measurement node, the measurement node being configured to access a data store storing data indicative of one or more predefined power flow patterns, wherein a power unit is electrically connected to the electricity distribution network and is configured to consume electric power from, and/or provide electric power to, the electricity distribution network such that a change in consumption and/or provision of electric power by the power unit results in a change in power flow in the network, the method comprising:

controlling power flow to and/or from the power unit in accordance with a control sequence, such that the consumption and/or provision of power by the power unit results in a power flow having a said predefined power flow pattern, and a characteristic of the power flow resulting from the unit is measurable by the measurement node.

The above method, in which the measurable characteristic comprises an amplitude of the power flow.

The above method, comprising receiving a data sequence representing the control sequence.

The above method, comprising receiving the data sequence at the power flow control unit from the measurement node.

The above method, comprising:
receiving an activation signal; and
initiating the control sequence on the basis of the received activation signal.

The above method, in which the received activation signal specifies a time for initiating the control sequence, and the method comprises initiating the control sequence at the specified time.

The above method, in which the predefined power pattern resulting from the power unit comprises a repeating pattern, and the method comprises controlling power flow to and/or from the power unit continuously according to the repeating pattern.

The above method, in which:
the control sequence represents a sequence of control signals for controlling a switch, the switch being configured to turn power flow to and/or from the power unit on or off in accordance with a control signal; and
the method comprises controlling the switch in accordance with the sequence of control signals.

The above method, comprising controlling an attenuator to modify power flow to and/or from the device.

The above method, comprising preventing power flow to and/or from the power unit in response to a disabling signal.

The above method, comprising receiving the disabling signal from the measurement node.

The above method, comprising:
measuring electric power consumption and/or provision at the power unit; and
sending an indication of a said measurement to the measurement node.

The above method, in which the measurement node comprises said data store.

The above method, in which each of a distributed group of said power units is connected to the electricity distribution network, and the method comprises:
controlling the power flow to and/or from the plurality of units in accordance with the control sequence, such that the consumption and/or provision of power by the plurality of power units is coordinated to collectively provide a power flow having the predefined power flow pattern and a characteristic measurable by the measurement node.

The above method, in which a plurality of said groups is connected to the network, and the method comprises controlling the power flow to and/or from each said group according to different control sequences, such that the power flow pattern resulting from a respective group is mutually orthogonal, or quasi-orthogonal, with respect to power flow patterns resulting from each other said group, such that a power flow characteristic associated with each of the power flow patterns can be measured at the measurement node independently of each of the other patterns.

A power flow control device configured to perform the above method.

A power unit comprising the above power flow control device.

The above power unit, the unit comprising position determining means for determining a position of the unit and an interface for sending an indication of a determined position of the mobile unit to the measurement node.

The above power unit, comprising a user interface for providing an indication of availability of the unit for provision and/or consumption of electric power to and/or from the electricity distribution network, and an interface for transmitting an indication of said availability.

A method of measuring power flow in an electricity distribution network comprising a measurement node, the electricity distribution network being connected to a group of one or more power units each configured to consume electric power from and/or provide electric power to the electricity distribution network such that a change in power provision and/or consumption by a said unit results in a change in power flow in the network, wherein each of the power units is associated with a respective power flow control device configured to control power flow to and/or from a power unit in accordance with a predefined control sequence, resulting in a power flow having a predefined pattern, the measurement node being configured to access a data store configured to store data indicative of one or more said patterns, the method comprising:

measuring a signal indicative of power flowing at the measurement node;

analysing the measured signal so as to correlate a component thereof with a said pattern, whereby to generate one or more correlated signals;

measuring a characteristic of the one or more correlated signals, thereby determining a contribution to said measured signal by the group of power units.

The above method, in which the characteristic comprises an amplitude of the power flow.

The above method, comprising sending a signal specifying said control sequence to each power unit of the group.

The above method, comprising sending an activation signal to the power units for activating, at a predetermined time, the control sequence.

The above method, in which said activation signal specifies a time of activation of said control sequence.

The above method, in which the predefined power flow pattern comprises a repeating pattern, and the power flow control devices are configured to control power to and/or from the group of one or more power units continuously according to the repeating pattern.

The above method, comprising allocating the control sequence in accordance with a power consumption and/or provision requirement relating to the one or more power units, whereby to control an energy consumption and/or provision of the power units.

The above method, in which the electricity distribution network is connected to a plurality of said groups, the measurement node stores data representing a plurality of said control sequences, and data indicating associations between the stored control sequences and the groups, and the method comprises:

correlating the measured signal with the stored sequences, so as to identify a contribution of a given group to the total power consumption and/or provision within the electricity distribution network.

The above method, comprising:

receiving, from at least one of said power units, a signal indicative of a measurement of electricity consumption and/or provision made at the unit;

comparing the received measurement with a determined contribution relating to the unit; and calibrating the electricity distribution node on the basis of said comparison.

The above method, in which the measurement node comprises said data store.

A measurement node configured to perform the above method of measuring power flow in an electricity distribution network.

A computer program comprising a set of instructions which, when executed on a processing unit, causes the processing unit to perform the above method of measuring power flow in an electricity distribution network.

A method of controlling electricity flow in an electricity distribution network, the electricity distribution network comprising a plurality of measurement nodes and a plurality of distributed groups of power units, each of said power units being configured to consume and/or provide electricity associated with the electricity distribution network, wherein each power unit in a given group is configured to be controlled by a control sequence assigned to the group, the control sequence controlling power consumption and/or provision by each unit of the group according to a predefined pattern, resulting in an associated power flow pattern, and each of the measurement nodes being configured to measure a characteristic of power flowing in the network associated with the power consumption and/or provision of one or more groups, the method comprising:

assigning a plurality of said control sequences to a first plurality of groups of units, such that a characteristic of power flow associated with the first plurality of groups is measurable by a first said measurement node, wherein the assigned control sequences result in mutually orthogonal patterns of power flow, whereby flow characteristics associated with each of the power flow patterns can be measured at the first node independently of each of the other patterns;

assigning a further control sequence to a further, different, group of units, such that a characteristic of modulated power flow associated with the further group of units is measurable by a further, different, measurement node; and controlling consumption or provision of power in the network in accordance with the assigned control sequences, wherein the further control sequence corresponding to a control sequence assigned to the first plurality of groups.

A method of controlling electricity flow within an electricity distribution network, the electricity distribution network comprising a measurement node and a plurality of power units, each of the power units being configured to consume and/or provide electricity associated with the electricity distribution network, wherein each of the power units is configured to be controlled by an assigned control sequence, the control sequence controlling power consumption and/or provision by the unit according to a predefined pattern, the method comprising;

assigning group membership to a plurality of the units, thereby defining at least one group; and assigning a said control sequence to the group, such that each unit of the group consumes and/or provides power in accordance with a predefined pattern corresponding to the assigned control sequence, resulting in a modulated power flow pattern having an characteristic measurable at the measurement node, the method further comprising:

measuring a characteristic of the modulated power flow pattern at the measurement node;

based on the measured characteristic and one or more predefined optimisation parameters, modifying the assigned group membership; and iterating said measurement and modification, whereby to optimise a measured characteristic associated with the group.

The above method, in which the assignment of group membership is based, at least in part, on a random selection technique.

The above method, in which the one or more optimisation parameters comprise a parameter relating to network operational requirements.

The above method, in which the one or more optimisation parameters comprise a parameter relating to the geographical distribution of the units.

The above method, in which characteristic measured comprises an amplitude characteristic and the one or more parameters comprise a parameter relating to amplitude measurement.

The above method, in which:
the electricity distribution network comprises a plurality of said measurement nodes; and
the method comprises defining a plurality of said groups, each group being associated with a node of the plurality of measurement nodes.

The above method, in which the one or more predefined amplitude measurement optimisation parameters include a parameter relating to attenuation of power flow between different nodes, and the method comprises:
assigning the group membership for a first group associated with a first said node such that the contribution of the first group to a power flow amplitude at a second, different node, is small compared to the total power flow amplitude at the second node.

The above method, in which the geographical separation of the first and second nodes is known and the control sequence assignment is based on the separation.

The above method, in which the network comprises a plurality of geographical areas each associated with a said node, and in which each unit located in a given said geographical area is associated with the node associated with that area.

The above method, in which one or more of the units is capable of moving between the geographical areas, and the method comprises:
monitoring a location of one or more of the units;
determining that one or more units have entered a given geographical area;
in response to said determination, associating the one or more units with a node associated with the given area;
analysing group membership and associated modulated power flow patterns in the given area; and
assigning group membership to the one or more units that have entered the given geographical area on the basis of the analysis.

The above method, in which a plurality of groups are associated with each node, and the method comprises assigning mutually quasi-orthogonal control sequences to each of the groups associated with a given node.

The above method, comprising assigning, to a group associated with a different node, a control sequence corresponding to a control sequence assigned to a group associated with the given node.

The above method, in which assignment of group membership is based on availability of one or more of the devices and the method comprises receiving an indication of an availability of a device from a user associated with the device.

A measurement node configured to perform the above method of controlling electricity flow in an electricity distribution network.

A computer program comprising a set of instructions which, when executed on a processing unit, causes the processing unit to perform the above method of controlling electricity flow in an electricity distribution network.

The invention claimed is:

1. A method of controlling power flow within an electricity distribution network, the electricity distribution network comprising a measurement node, the measurement node being configured to access a data store storing data indicative of one or more predefined power flow patterns each associated with a group of power units, including a first predefined power flow pattern associated with a first group of power units, each power unit being electrically connected to the electricity distribution network and being configured to consume electric power from, and/or provide electric power to, the electricity distribution network such that a change in consumption and/or provision of electric power by each of the power units results in a change in power flow in the network, wherein each power unit in the first group of power units has an associated power flow control device for controlling power consumed from, and/or provided to, the electricity distribution network, the power flow control device associated with each power unit being different from power flow control devices associated with each other power unit, the method comprising:
generating, at each power flow control device, a first control sequence, wherein the first control sequence defines a sequence of control signals for controlling the power flow to and/or from each of the power units in the first group of power units in accordance with the first predefined power flow pattern; and
controlling, at each power flow control device, power flow to and/or from each of the respective power units in said first group of power units in accordance with the first control sequence such that the consumption and/or provision of power by each of the power units in the first group of power units is varied according to said first predefined power flow pattern,
thereby coordinating consumption and/or provision of power by the power units in the first group of power units to provide a collective power flow in the electricity distribution network, the collective power flow having a pattern corresponding to said first predefined power flow pattern, and a power flow characteristic measurable by the measurement node.

2. A method according to claim 1, in which the measurable characteristic comprises an amplitude of the power flow.

3. A method according to claim 1, in which:
the control sequence represents a sequence of control signals for controlling a switch, the switch being configured to turn the power flow to and/or from a first power unit in the first group of power units on or off in accordance with a control signal; and
the method comprises controlling the switch in accordance with the sequence of control signals.

4. A method according to claim 1, comprising preventing the power flow to and/or from each of the power units in the first group of power units in response to a disabling signal received from the measurement node.

5. A method according to claim 1, in which a plurality of said groups of power units are connected to the network, and the method comprises controlling the power flow to and/or from each said group of power units according to different control sequences, such that the power flow pattern resulting from a respective group of power units is mutually orthogonal, or quasi-orthogonal, with respect to power flow patterns resulting from each other said group of power units, such that a power flow characteristic associated with each of the power flow patterns can be measured at the measurement node independently of each of the other patterns.

6. A group of power flow control devices configured to perform the method of claim 1.

7. A group of power units comprising a group of power flow control devices according to claim 6, each power unit comprising position determining means for determining a position of the power unit and an interface for sending an indication of a determined position of the power unit to the measurement node.

8. A group of power units comprising a group of power flow control devices according to claim 6, each power unit comprising a user interface for providing an indication of availability of the power unit for provision and/or consumption of electric power to and/or from the electricity distribution network, and an interface for transmitting an indication of said availability.

9. A method according to claim 1, further comprising, storing one of more control sequences in respective power flow control devices.

10. A method according to claim 1, wherein the power units associated with the first group of power units are distributed among a plurality of premises.

* * * * *